United States Patent [19]
Van Berkel

[11] Patent Number: 5,463,216
[45] Date of Patent: Oct. 31, 1995

[54] IMAGE SENSOR

[75] Inventor: Cornelis Van Berkel, Hove, Brighton, England

[73] Assignee: U.S. Philips Corporation, New York, N.Y.

[21] Appl. No.: 185,429

[22] Filed: Jan. 21, 1994

[30] Foreign Application Priority Data

Jan. 25, 1993 [GB] United Kingdom ............... 9301405

[51] Int. Cl.$^6$ ........................... H01L 27/14; H01J 40/14
[52] U.S. Cl. ................................. 250/208.1; 257/435
[58] Field of Search ................. 250/208.1, 208.2, 250/216, 214.1, 578.1; 257/431–435; 358/212, 213.27, 213.26

[56] References Cited

U.S. PATENT DOCUMENTS

| | | | |
|---|---|---|---|
| 4,078,243 | 3/1978 | De Bar et al. | 257/435 |
| 4,382,187 | 5/1983 | Fraleux et al. | 250/578 |
| 4,395,736 | 7/1983 | Fraleux | 358/213 |
| 4,609,824 | 9/1986 | Munier et al. | 250/578 |
| 4,689,652 | 8/1987 | Shimada et al. | 257/435 |
| 4,727,407 | 2/1988 | Nobue et al. | 257/435 |
| 4,739,178 | 4/1988 | Nobue | 250/208.1 |
| 4,883,967 | 11/1989 | Tsutsui et al. | 250/370.01 |
| 4,945,242 | 7/1990 | Berger et al. | 250/367 |
| 4,948,978 | 8/1990 | Guyot | 250/370.11 |
| 4,952,788 | 8/1990 | Berger et al. | 250/208.1 |
| 5,324,930 | 6/1994 | Jech, Jr. | 250/208.1 |

FOREIGN PATENT DOCUMENTS

| | | |
|---|---|---|
| 0154962 | 9/1985 | European Pat. Off. . |
| 0233104 | 8/1987 | European Pat. Off. . |
| 0237365 | 9/1987 | European Pat. Off. . |
| 162980 | 3/1989 | Japan . |

OTHER PUBLICATIONS

"Photolytic Technique For Producing Microlenses In Photosensitive Glass" Borrelli et al, Applied Optics vol. 24, No. 16, Aug. 15, 1985.
"Microlens Arrays" Mike Hutley et al, Physics World, Jul. 1991, pp. 27–32.
"Application Of Microlenses To Infrared Detector Arrays" N. T. Gordon et al, Infrared Physics, vol. 31, No. 6, 1991 pp. 599–604.

Primary Examiner—Stephone B. Allen
Attorney, Agent, or Firm—Michael J. Balconi-Lamica

[57] ABSTRACT

A substrate (2) carries an array (3) of photosensitive elements (4) each having a given surface area (4a) capable of detecting light. An array (5) of lens elements (6) is provided over the photosensitive array (5) so that each lens element (6) is associated with a respective photosensitive element (4) for concentrating light incident on the lens element (6) onto the associated photosensitive element (4). The given lo surface area (4a) of each photosensitive element (4) is covered by an opaque layer (7) for preventing light from reaching the photosensitive element (4) and a respective light transmissive region (8) which is small in relation to the surface area (4a) of the photosensitive element (4) is provided in the opaque layer (7) over each photosensitive element (4) at or near the focal point (F) of the associated lens element (6) so that, for each photosensitive element (4), the majority of the given surface area (4a) is shielded from any incident light by the opaque layer (7) and the light transmissive region (8) defines within the given surface area (4a) of the photosensitive element (4) a surface portion (4b) for receiving light which is small in relation to the given surface area (4a).

13 Claims, 3 Drawing Sheets

IMAGE SENSOR

BACKGROUND OF THE INVENTION

This invention relates to an image sensor comprising an insulating substrate carrying an array of discrete photosensitive elements each having a given surface area for detecting light incident on the photosensitive element and an array of lens elements provided over the photosensitive array so that each lens element is associated with a respective photosensitive element for concentrating light incident on the lens element onto the associated photosensitive element.

EP-A-154962 describes such an image sensor in which the photosensitive elements are formed on top of a light shielding layer provided on a light transmissive substrate and the array of lens elements is fabricated either on top of the photosensitive array or on the other side of the light transmissive substrate by one of several different methods, for example using photosensitive resist or by ion implantation into a light transmissive substrate so as locally to alter the refractive index of the substrate. An object to be imaged is placed in front of the lens array and light transmissive regions in the light shielding layer allow light to pass through the substrate to be incident on the object, for example a document, to be imaged. Light reflected by the object is incident on the lens elements and each lens element serves to concentrate, generally focus, the incident light onto the associated photosensitive element.

The use of such lens elements enables a short focal length to be achieved and enables the pitch of the photosensitive element array to be reduced allowing the optical path length to become equivalent to that of a comparable intimate contact image sensor. Such an arrangement enables one-to-one correspondence images to be formed without the need for intimate contact between the object being imaged and the photosensitive array whilst avoiding the problems of possible electrostatic and mechanical damage inherent in an intimate contact image sensor. As described in EP-A-154962, the photosensitive elements used are small and so have a small surface area in comparison to the size of the imaging area, that is the area over which each lens element collects light, because of the focusing effect provided by the lens element. The use of such small photosensitive elements restricts the spread of angles of incidence (the acceptance angle) over which the image sensor receives light which should assist in reducing the possibility of light from one imaging area being focused onto two or more adjacent photosensitive elements rather than simply onto the photosensitive element associated with the lens element which is intended to receive light from that imaging area and thus should improve the resolution and thus the sharpness of the obtained image. Also, the use of such small photosensitive elements should assist in reducing leakage currents. This however requires accurate control over the formation of the photosensitive elements and because, inter alia, of the inherent thickness of the photosensitive elements it can be difficult to form extremely small photosensitive elements and there will in practice be a limit to the degree to which the size of the photosensitive elements can be reduced without detrimentally effecting the reproducibility of the manufacturing process and thus of the characteristics of the image sensor.

SUMMARY OF THE INVENTION

According to the present invention, there is provided an image sensor comprising an insulating substrate carrying an array of discrete photosensitive elements each having a given surface area capable of detecting light and an array of lens elements provided over the photosensitive array so that each lens element is associated with a respective photosensitive element for concentrating light incident on the lens element onto the associated photosensitive element, characterized in that the given surface area of each photosensitive element is covered by an opaque layer for preventing light from reaching the photosensitive element and in that a respective light transmissive region which is small in relation to the surface area of the photosensitive element is provided in the opaque layer over each photosensitive element at or near the focal point of the associated lens element so that, for each photosensitive element, the majority of the given surface area is shielded from any incident light by the opaque layer and the light transmissive region defines within the given surface area of the photosensitive element a surface portion for receiving light which is small in relation to the given surface area.

Thus in an image sensor in accordance with the invention, the surface portion of each photosensitive element capable of receiving light is defined by the associated light transmissive region of the opaque layer so that a desired restriction of the angle of acceptance of the image sensor can be achieved easily without the necessity to form very small photosensitive elements. Indeed, the photosensitive elements can be made to have a surface area commensurate with the available technology and the desired image area pitch of the image sensor so that reproducibility of the characteristics of the photosensitive elements can be maintained. Furthermore, the formation of light transmissive regions, generally apertures, in an appropriate opaque layer can be achieved with greater ease and accuracy than can the formation of very small photosensitive elements so enabling the light transmissive regions to define effective light sensitive surface portions for the photosensitive elements which are smaller than can be achieved by simply reducing the size of the photosensitive elements. This should facilitate a further improvement in resolution and sharpness of the obtained image. Also, especially in the case where the photosensitive elements are diodes, the relatively large area of the photosensitive diodes which is shielded by the opaque layer forms a relatively large storage capacitor considerably increasing the dynamic range of the image sensor and avoiding or at least reducing the need for additional capacitors which might prove necessary in the case of the small photosensitive diodes used in the examples described in EP-A-154962.

The lens elements may be formed directly on the opaque layer or any layer covering the opaque layer. As an alternative, the lens elements may be carried by a further substrate mounted to the substrate carrying the photosensitive array. The formation of the lens elements on a separate substrate enables the manufacturing processes for the photosensitive and lens element arrays to be optimised separately so that it is not necessary to compromise in either case.

In one arrangement, the opaque layer may be common to all the photosensitive elements and be carried by the further substrate which may provide advantages from the point of ease of manufacture. Preferably, however, the opaque layer is provided directly on the surface area of each photosensitive element so eliminating any space between the photosensitive element and the opaque layer and thus reducing the possibility of scattered light passing through the aperture in the opaque layer which could otherwise detrimentally affect the resolution obtainable. In this case, a separate opaque layer may be provided on each photosensitive element. This enables the opaque layer to be formed of a conductive layer without fear of accidentally shorting together adjacent photosensitive elements. Where such separate electrically conductive opaque layers are used, the opaque layers may also form one electrode of the associated photosensitive element so avoiding the need for any additional deposition steps to enable formation of the opaque layers and allowing the light transmissive regions to be formed as apertures simply by use of an appropriate mask and etching technique.

Generally, the area of each light transmissive region is at most about 5 percent of the area of the associated photosensitive element. Preferably, the ratio of the area of each light transmissive region to the surface area of each photosensitive element is in the region of from approximately 1:800 to approximately 1:8000. The photosensitive elements may have any suitable size, for example they may be 40 μm by 40 μm or as large as, for example, 150 μm by 150 μm or 200 μm by 200 μm. Typically, where the photosensitive elements have a surface area in the region of 40 μm by 40 μm, then the light transmissive region may be anything from 10 μm down to 0.5 μm, depending on the distance from the image sensor at which it is desired to be able to image an object.

Any suitable technique may be used to form the lens elements. For example, the lens elements may be formed of reflowed photosensitive resist. In another example, the lens elements may be formed by ion implanted regions of altered refractive index in a light transmissive substrate.

The photosensitive array may comprise a two-dimensional actively addressed array. However, the present invention could also be applied to passive arrays and to one-dimensional as well as two-dimensional arrays. The photosensitive elements may comprise photosensitive diodes, generally pin diodes although Schottky diodes could be used. Other forms of photosensitive elements may be used, for example photosensitive thin film diodes (MIMs) or thin film transistors or photosensitve resistors.

It should be understood that, as used herein, the term "opaque layer" means a layer which does not transmit sufficient of the light to which the photosensitive elements are sensitive for that light to be detectable by the photosensitive elements. As used herein, the term "light" means electromagnetic radiation falling within the area of the spectrum visible to the human eye, plus the near infra red. Also, as used herein, the term "light transmissive region" means a region which transmits sufficient of the light to which the photosensitive elements are sensitive for that light to be readily detectable by the photosensitive elements It should be noted that JP-A-1-62980 describes the provision of a light shielding layer similar to that used in EP-A-154962 which allows for back-illumination through the image sensor of an object to be viewed via a window in the light shield whilst shielding the photosensitive elements from the light incident on the back of the image sensor and that U.S. Pat. No. 4,883,967 describes a radiation detector in which the individual photosensitive elements are defined by means of an apertured mask. Also, U.S. Pat. No. 4,948,978 describes an image sensor intended for detection of X-rays and the like in which a scintillation or phosphor layer for converting X-rays to visible light is bounded by two light reflective layers of which the one adjacent the photosensitive element array is formed with an aperture over each photosensitive element so that light which does not initially pass through an aperture is reflected back and forth in the phosphor layer until it finally passes through an aperture. However, in order to avoid cross-talk between adjacent photosensitive elements, the phosphor has to be divided into separate cells each associated with a given photosensitive element.

BRIEF DESCRIPTION OF THE DRAWINGS

Embodiments of the present invention will now be described, by way of example, with reference to the accompanying drawings, in which.

DETAILED DESCRIPTION OF THE PREFERRED EMBODIMENTS

Figure 1:
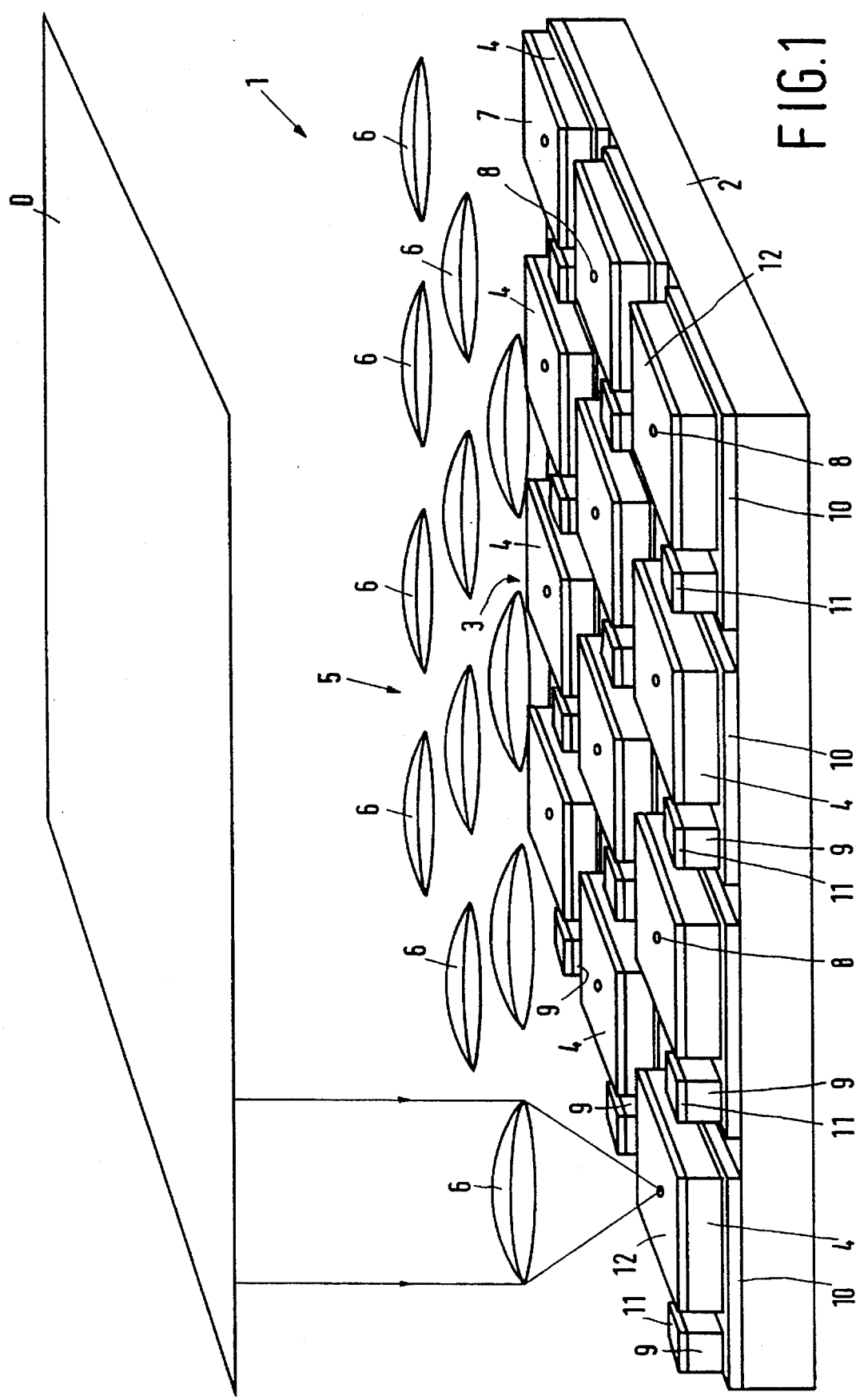
FIG. 1 is a schematic perspective view of part of a simplified image sensor in accordance with the invention.

Referring now to the drawings there is illustrated an image sensor I comprising an insulating substrate 2 carrying an array 3 of discrete photosensitive elements 4 each having a given surface area 4a capable of detecting light and an array 5 of lens elements 6 provided over the photosensitive array 5 so that each lens element 6 is associated with a respective photosensitive element 4 for concentrating light incident on the lens element 6 onto the associated photosensitive element 4. In accordance with the invention, the given surface area 4a of each photosensitive element 4 is covered by an opaque layer 7 for preventing light from reaching the photosensitive element 4 and a respective light transmissive region 8 which is small in relation to the surface area 4a of the photosensitive element 4 is provided in the opaque layer 7 over each photosensitive element 4 at or near the focal point F of the associated lens element 6 so that, for each photosensitive element 4, the majority of the given surface area 4a is shielded from any incident light by the opaque layer 7 and the light transmissive region 8 defines within the given surface area 4a of the photosensitive element 4 a surface portion 4b for receiving light which is small in relation to the given surface area 4a.

Thus in an image sensor I in accordance with the invention, the surface portions of the photosensitive elements are defined by the light transmissive portions 8 of the opaque layer 7 so that a desired restriction of the angle of acceptance of the image sensor I can be achieved without the necessity to form very small photosensitve elements. The photosensitive elements 4 can thus have surface areas 4a commensurate with the available technology and the desired image area pitch of the image sensor 1 so that reproducibility of the characteristics of the photosensitive elements 4 can be maintained. The formation of the light transmissive regions as, for example, apertures 8 in an appropriate opaque layer 7 can be achieved with greater ease and accuracy than can the formation of very small photosensitive elements so enabling the apertures 8 to define effective light sensitive areas 4b for the photosensitive elements 4 which are smaller than can be achieved by simply reducing the size of the photosensitive elements 4 so facilitating a further improvement in resolution and sharpness of the images which can be obtained. In the examples to be described below with reference to the Figures especially where the photosensitive elements are diodes, the relatively large area of each photosensitive diode 4 which is shielded by the opaque layer 7 forms a relatively large storage capacitor considerably increasing the dynamic range of the image sensor 1 and avoiding or at least reducing the need for additional capacitors which might prove necessary in the case of the small photosensitive diodes used in the examples described in EP-A154962.

Figure 2:
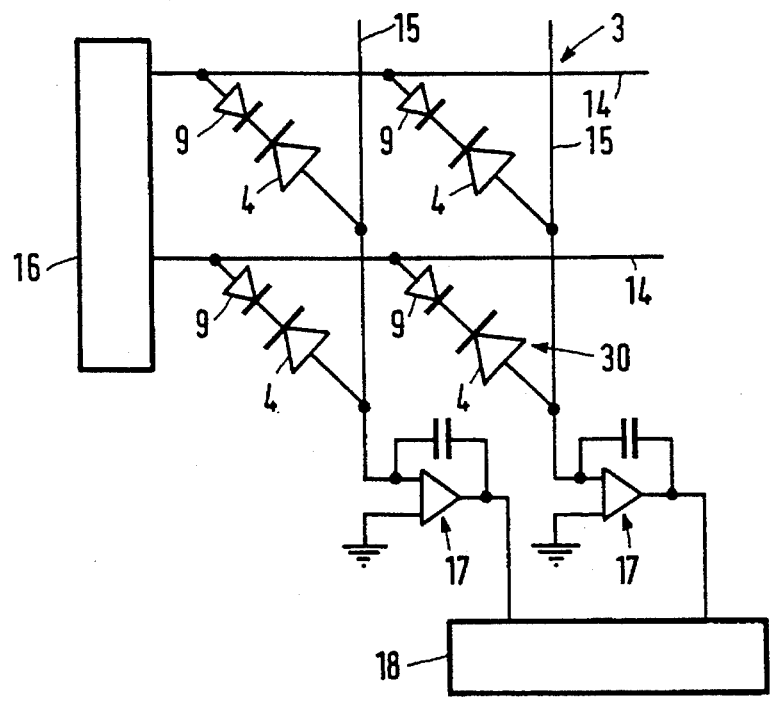
FIG. 2 is a schematic layout diagram for one example of a photosensitive array for an image sensor in accordance with the invention.
Figure 3:
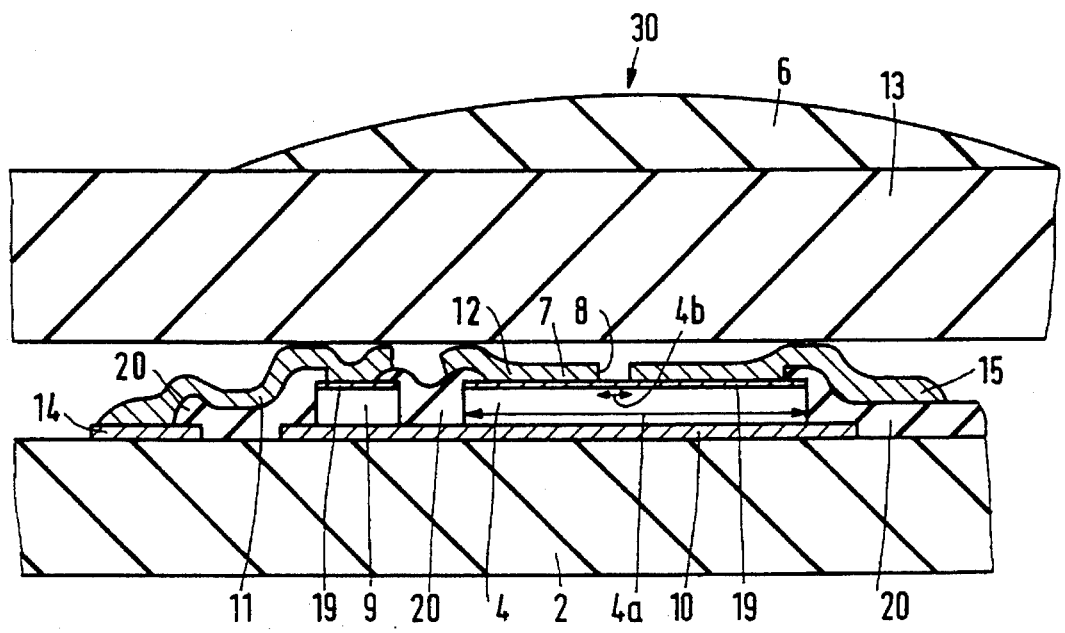
FIG. 3 is a cross-sectional view through part of one imaging element or pixel of one example of an image sensor in accordance with the invention.

Referring now specifically to the drawings, FIG. 1 illustrates by way of a schematic perspective view a simplified version of part of an image sensor 1 (only twelve photosensitive elements 4 and their associated lens elements 6 being shown in FIG. 1) in accordance with the invention while FIG. 2 shows schematically a circuit layout for that image sensor 1 and FIG. 3 shows a cross-sectional view through part of one imaging element 30 of the image sensor 1.

In the example illustrated in FIGS. 1, 2 and 3, the image sensor 1 comprises a light transmissive substrate 2 which is formed of any suitable electrically insulative material, generally a glass, on which the photosensitive element array 3 is formed by thin film technology.

The photosensitive elements 4 are in this example photosensitive pin diodes and the array is a two-dimensional actively addressed array in which each photosensitive element 4 is associated with a switching element 9. Any suitable form of switching element may be used. In the examples to be described, the switching elements comprise pin diodes of a similar structure to but of somewhat smaller size than, typically one tenth the area of, the photosensitive diodes 4. Forming the photosensitive elements 4 and the switching elements 6 as the same type of device should simplify the manufacturing process.

Each photosensitive diode 4 and the associated switching diode 9 share a common first electrode 10 which is opaque (generally formed of a sufficient thickness of chrome) and serves to shield the photosensitive and switching elements from any light incident on the substrate 2. Each switching diode 9 has a respective second opaque electrode 11 which also shields the switching diode 9 from light incident on the image sensor 1 and each photosensitive diode 4 has a respective second electrode 12.

In this example, the photosensitive diode second electrodes 12 also form the opaque layer 7 so that a separate opaque layer 7 is provided for each photosensitive element 4. The provision of the opaque layer 7 directly on the surface area 4a of each photosensitive element 4 avoids the possibility of any space between the photosensitive element and the opaque layer, thus reducing the possibility of scattered light passing through the apertures 8 which could otherwise detrimentally affect the resolution obtainable. The fact that the opaque layers 7 also form one electrode 12 of the associated photosensitve elements 4 avoids the need for any additional deposition steps to enable formation of the opaque layers 7 and allows the apertures 8 to be formed simply by use of an appropriate mask and etching technique. The apertures 8, as indicated above, define the only portions 4b of the surface areas 4a which can receive light.

As can be seen from FIG. 2, the photodiodes 4 are arranged in a matrix array so as each to be associated with its switching element, in this case a diode, 9. The photosensitive and switching elements 4 and 6 are arranged in a matrix of m-1 rows and n-1 columns with, in this example, the cathode of each switching element being connected to the cathode of the associated photodiode 4, the anode of each switching diode in a given row being connected to a given row conductor 14 and the anode of each photodiode in a given column being connected to a given column conductor 15.

Although only two rows and two columns are shown in FIG. 2, there generally will be many more. The actual size and pitch (the distance between the same location on adjacent elements) of the array will depend upon the desired application. Thus, for example, if the image sensor needs to comply with the G3 facsimile standard, then a pitch of 120 µm will be required. In a typical example, the photosensitive elements 3 will be arranged to have a pitch of 200 micrometers and may be 40 µm by 40 µm in area, although the photosensitive elements could be larger, for example 150 µm by 150 µm or even 190 µm by 190µm and the overall array may, for example, be of sufficient size to image an A4 document.

The row conductors 14 are connected to a row driver or decoder/addressing circuit 16 of conventional type while each column conductor 15 is connected via a respective charge sensitive amplifier 17 to a readout circuit 18 of known type. In operation of such a photosensitive army 3, the switching diodes 9 are normally reverse-biased and a photogenerated charge accumulates on the intrinsic capacitance of a photodiode when light is incident on the photodiode via the associated pinhole 8. In order to read out stored charge, a positive voltage pulse is applied to the row conductor 14 connected to the switching diode 9 which then becomes forward-biased allowing the accumulated charge to flow down the column conductor to the charge sensitive amplifier 17 and thence to the readout circuit 18 where it is registered.

The structure described thus far is formed, as can be seen from FIG. 3, by first depositing and patterning an opaque electrically conductive layer, generally chrome, to form the first electrodes 10 and at least part of the row conductors 14. Layers of semiconductor material, for example amorphous silicon, are deposited with, in sequence, n conductivity, intrinsic conductivity and p conductivity and then patterned to define, in known manner, the nip diode structures for the switching and photo diodes 4 and 9. Typically the diodes may be about 0.5 µm (micrometers) thick. A transparent, generally indium tin oxide, conductive layer 19 may optionally be provided on the photodiode as is known in the art.

A passivating layer, generally silicon nitride, 20 is then provided over the structure and patterned to define windows to enable a subsequent layer of opaque conductive material, generally again a sufficient thickness of chrome, to be deposited and patterned to define the second electrodes 11 and 12 and the column conductors 15 which may be formed integrally with the associated second electrodes. In order to improve the conductivity, the row and column conductors 14 and 15 may have a top layer of a suitable more highly electrically conductive material such as aluminium. This top layer may also be provided on the second electrodes 11 and 12 but care should be taken not to make the second electrodes 12 too thick as it is desirable that the opaque layer 7 be as thin as is practically possible while still being opaque so that the apertures 8 do not have any appreciable thickness. Typically, the chrome layer may be about 100 nm (nanometers) thick.

The light transmissive regions are formed in this case by defining apertures 8 through the opaque layer. These apertures may be formed using any suitable technique, although the precise technique used will depend upon the desired size of the apertures 8. Thus where relatively large apertures, of the order of 5 to 10 micrometers, are required then a photolithographically defined mask and a suitable wet etching technique may be used whereas when smaller apertures are required a more accurate technique such as the use of a reactive ion anisotropic etching technique, or possibly even a laser etching technique, may be advisable. The required size for the apertures will depend upon the desired use of the image sensor and will be discussed in greater depth below.

A light transmissive passivating layer (not shown) such as a layer of silicon nitride or a planarising layer such as a layer of polyimide which has the advantage of providing a relatively flat upper surface onto which the lens array can be mounted may be provided over the structure.

It will of course be appreciated that any suitable form of photosensitive element array and any suitable circuit layout could be used. Thus, for example the switching elements could be thin film transistors as described in, for example, U.S. Pat. No. 4,382,187 or any of the layouts described in any of EP-A-233104, EP-A-237365, U.S. Pat. No. 4395736, U.S. Pat. No. 4,609,824, U.S. Pat. No. 4,945,242 and U.S. Pat. No. 4,952,788 could be used.

Figure 4:
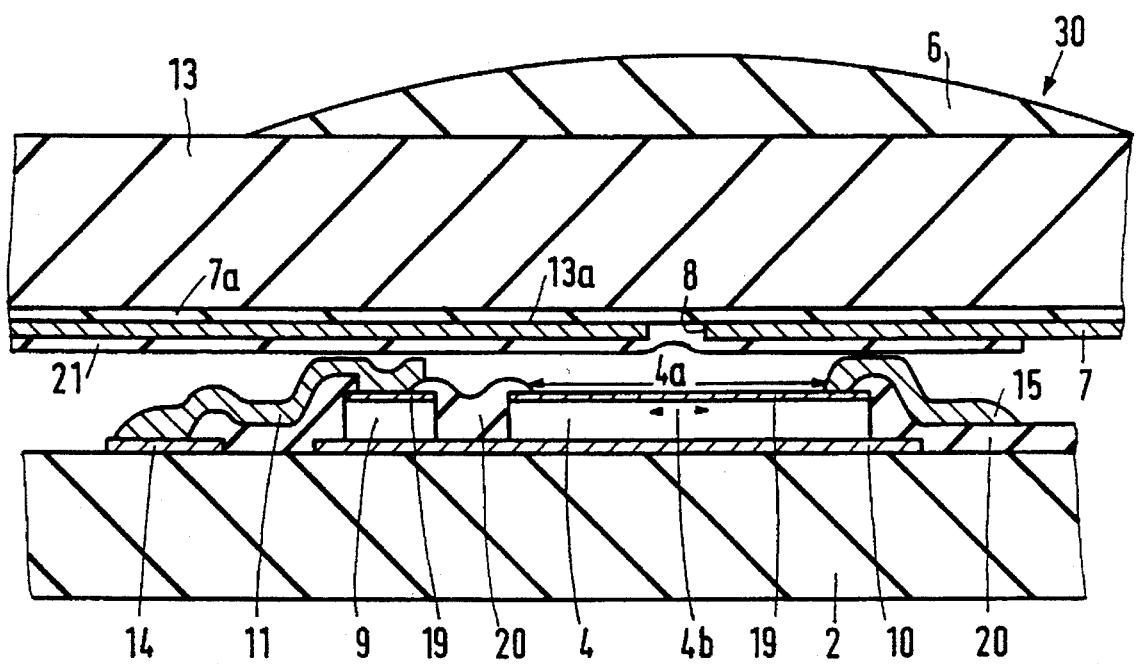
FIG. 4 is a cross-sectional view through part of one imaging element or pixel of another example of an image sensor in accordance with the invention.

The lens element array 5 is in this example carried by a separate substrate 13 (see FIG. 3 and 4. This substrate has been omitted from FIG. 1 in the interests of clarity.) and may thus be formed in any suitable fashion without having to worry about the effects of the processing on the photosensitive array 3. The second substrate 13 may be formed of any suitable light transmissive insulative material such as a glass, although its precise nature may depend upon the manner in which the lens elements 6 are formed. The lens elements 6 may for example be formed by one of the techniques described in EP-A-154962 such as ion implantation into appropriate parts of the substrate to locally change the refractive index. Another possibility would be to use the technique described in a paper entitled "Photolytic technique for producing microlenses in photosensitive glass" by Borrelli et al published in Applied Optics Volume 24 No. 16 of 15 Aug. 1985.

It is however preferred that in this example the lens elements 6 be manufactured by coating the second substrate 13 which is typically a 0.5 mm thick glass substrate with a viscous photosensitive resist having, in this example, a thickness of about 15 µm, defining a mask over the resist having circular windows somewhat smaller than the desired size of the lens elements. The lens elements 3 should of course have the same pitch as the photosensitive array 3 and thus for the example given above, the windows in the mask will be of 190 µm diameter at a pitch of 200 µm. The resist is then exposed and developed to define an array of circular resist islands each being at the desired location of a lens element 6. The resultant structure is then heated or baked at about 150° C. (degrees Celsius) at which temperature the resist melts and each circular island is drawn by surface tension into a lens shape. In this example lens elements 6 with a pole height of 27 µm and a focal length of 500 µm (in glass) were obtained.

Such a technique is described, for example, in a review article by Mike Hutley, Richard Stevens and Dan Daly entitled "Microlens Arrays" and published in Physics World, July 1991 at pages 27 to 32. The original thickness of the resist determines the focal length of the lens elements. The thickness may be, typically, 15 µm.

The lens element array 5 carrying substrate 13 is mounted to the photosensitive array substrate 2 in any suitable manner, so that the apertures 8 are at or near the focal point of the lens elements 6. Where, for example, the photosensitive element array 3 is covered by a planarising passivating layer, then the lens element array could simply be glued on top of the photosensitive array 3. Another possibility would be to use the glass spacer technology known for liquid crystal display devices. In the present example, the thickness of the glass substrate 13 and the focal lengths of the lens elements 6 are such that the focal point F of each lens element 6 lies on the surface of the glass substrate 13 opposed to the lens elements and the substrate 13 is mounted directly onto the photosensitive element array 3.

As an alternative to the arrangement described above and shown in FIG. 3, the opaque layer 7 need not be formed by the second electrodes 12 of the photosensitive elements but could be formed by a separate layer or layers. In the example illustrated in FIG. 4, the opaque layer 7 is not provided on the photosensitive array but is formed on the surface 13a of the substrate 13 opposed to the lens element array 5. The fact that the opaque layer 7 does not in this example also form the second electrodes 12 means that the opaque layer need not necessarily be electrically conductive but could be formed of a suitable insulator. However, in the example illustrated in FIG. 4, the opaque layer 7 is again formed of chrome and the light transmissive regions 8 are formed as apertures in the manner described above. Where the opaque layer 7 is formed of a material, such as chrome, which will reflect a significant amount of light, then a light absorbing layer 7a, such as a layer of dark polyimide should be provided between the substrate 13 and the opaque layer 7. Also, where the opaque layer 7 is as described conductive and the photosensitive element array 3 is not protected by a passivating layer, then a covering layer 21 of a light transmissive insulator such as silicon nitride is provided over the opaque layer so as to prevent the opaque layer shorting out the photosensitive elements 4. Such a structure may be relatively easy to manufacture as the formation of the opaque layer is carried out separately from that of the photosensitive element array, enabling an existing array to be modified for use in an image sensor in accordance with the invention. Care should however be taken that the separation of the opaque layer 7 from the photosensitive element array 3 is not so great that significant problems arise because of the scattering of light within the sensor.

The resolution of the image sensor area is determined by the pitch of the photosensitive array which should of course not be larger than the smallest feature desired to be imaged. The area of each lens element 6 effectively defines the area over which light can be collected to be imaged on the associated photodiode 4 (hereinafter referred to as the imaging area). As will be appreciated, each photosensitive element 4 will provide a signal indicative of the total light received from the associated imaging area. Where the lens elements 6 are circular, then light will not be collected from the gaps between the lens elements 6. However, lens elements which completely fill the surface area on which they are formed can be manufactured and have been described in a paper entitled "Application of microlenses to infrared detector arrays" by N. T. Gordon, C. L. Jones and D. J. Purdy published in Infrared Physics Volume 31 No. 6 at pages 599 to 604 in 1991.

In operation of such an image sensor, the object being imaged, for example the document D is illuminated by ambient light. In the example illustrated in FIG. 3 at least some of the illuminating light may be provided by way of back-illumination through transparent areas (for example the area A shown in FIG. 3) of the sensor in a manner similar to that described in EP-A-154962. This should be of particular advantage where the object to be imaged is relatively close to the image sensor and the natural illumination of the object is low. Light reflected from the object and incident perpendicularly of the focal plane of a lens element 6 is focused through the associated aperture 8 onto the underlying light receiving surface portion 4b of the photodiode surface area 4a whereas light incident obliquely of the focal plane of a lens element 6 is focused onto the opaque layer 7 away from the aperture 8 and is thus not detected by the photodiode 4. This enables an image to be formed which is in one-to-one correspondence with the object being imaged, for example the document D illustrated schematically in FIG. 1, without the need for the object to be in intimate contact with the image sensor.

The area of the lens elements 6 determining, as indicated above, the area from which, and thus the amount of, light can be concentrated onto the associated photosensitive element 4. The maximum distance which the object, for example the document D shown in FIG. 1, can be separated from the focal plane or point F yet still enable an image with good resolution and of good clarity to be obtained is, to a reasonable approximation, that at which the image sensor will focus light from an area just equal to the pitch of the photosensitive element array 3 which is the same as that of lens element array 5; any larger and cross-talk will occur between adjacent elements. This distance will depend upon the pitch of the lens element array 5 (that is the pitch of the photosensitive element array 3), the size of the light transmissive regions 8 and the focal length of the lens elements. To a rough approximation this distance will be determined by the following equation:

$$h' = h \cdot d'/d$$

where h' is the separation of the object D from the focal plane F containing the focal points of the lens elements 6, h is the focal length of the lens elements 6, d' is the diameter of the image area 20 and d is the diameter of the light transmissive regions 8, the latter two being assumed to be circular as in the examples described above because this has the advantage that the angle of acceptance in each case is uniform about the periphery. However, depending upon the particular requirements for the image sensor, the apertures 8 and lens elements 6 need not necessarily be circular.

In the example illustrated above where the lens elements 6 have a focal length h of 500 µm and the photosensitive elements 4 have a pitch of 200 µm, then even if the aperture diameter d is as large as 10 µm (which can easily be achieved using a simple wet etching technique), then h'=500.200/10 µm, that is 10 mm and good images can be obtained with the object being imaged, for example the document D, placed about one centimeter away from the image sensor 1. Reducing the diameter of the apertures 8 considerably increases the distance h' which the object D can be away from the image sensor 1 and still provide a good one to one sharp image. Thus if the aperture diameter d is halved to 5 µm, then the distance h' increases 2 cm and for an aperture diameter of between 0.5 and 1 µm which can easily be obtained using anisotropic etching techniques, then the distance h' increases to 10 cm. Clearly an increase in the focal length h will also increase the distance h' from which an object can be viewed. The focal length of the lens elements 6 may be adjusted as discussed above by adjusting the thickness of the resist which is reflowed to form the lens elements. Another way to increase the focal length of the lens elements 6 would be to provide a layer of a material having a refractive index intermediate that of the lens elements and air over the lens elements 6 as described in JP-A-2-251902. To take an example, if the lens elements 6 are formed using a suitable technique to have a focal length of 5 mm objects up to a meter away could be imaged using apertures of 1 µm.

It should of course be noted that while is important is for the apertures 8 to have the same pitch as the lens elements 6 so that each aperture 8 is similarly located with respect to the associated lens element 6 and for the areas of the apertures 8 to be as uniform as possible, the actual alignment to the photosensitive elements 4 is not so critical because all that is required is that the aperture 8 in each case lies over the surface area 4a of the photosensitive element 4.

Figure 5:
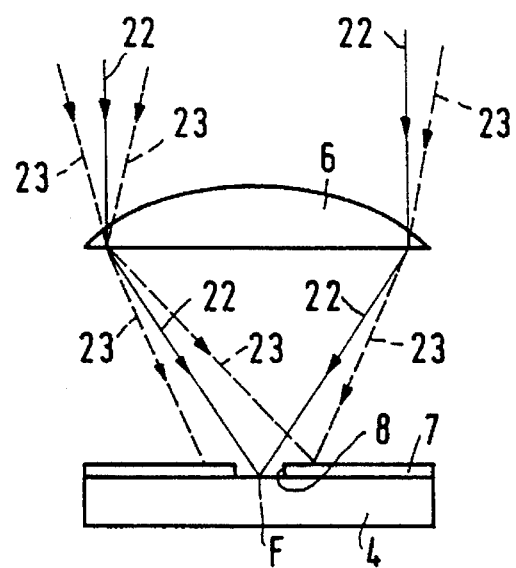
FIGS. 5 is a schematic ray diagram for illustrating the effect of the location of a light transmissive region of an opaque layer of an image sensor in accordance with the invention with respect to the focal point of the associated lens element.

As mentioned above, the apertures 8 should be located at or near the focus F of the lens elements 4. Clearly positioning the apertures slightly away from the focus will not significantly affect the amount of light which can pass through the apertures 8 but care should be taken, as will be evident to a person skilled in optics, especially when the apertures 8 are quite small that they are not positioned sufficiently far from the focal point that some of the light being focused onto the aperture cannot pass through. FIG. 5 is a schematic ray diagrams for illustrating this point where an aperture 8 is positioned at the focal point F of the associated lens element 6 and shows that normally incident light 22 (shown by solid lines) is focused onto the aperture 8 whereas oblique light 23 (shown by dashed lines)is focused away from the aperture 8 and so cannot pass through to be detected by the associated photosensitive element 4. It will be appreciated that the incoming light, although being concentrated onto the associated photosensitive element 4, will not necessarily be focused at the surface portion 4b. This is however not important as the photosensitive element 4 is capable of detecting only the total light incident thereon and features smaller than the pitch of the photosensitive elements cannot be resolved.

Although in the above described examples, the photosensitive array comprises a two-dimensional actively addressed array, the present invention could be applied to passive arrays and to one-dimensional as well as two-dimensional arrays. Also other forms of photosensitive elements may be used for example other forms of diodes such as Schottky diodes could be used or other forms of photosensitive elements may be used, for example photosensitive thin film diodes (sometimes known as MIMs) or thin film transistors or photosensitve resistors.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. An image sensor comprising an insulating substrate carrying an array of discrete photosensitive elements each having a given surface area capable of detecting light and an array of lens elements provided over the photosensitive array, so that each lens element is associated with a respective photosensitive element for concentrating light incident on the lens element onto the associated photosensitive element, characterized in that the given surface area of each photosensitive element is covered by an opaque layer for preventing light from reaching the photosensitive element and in that a respective light transmissive region which is small in relation to the surface area of the photosensitive element is provided in the opaque layer over each photosensitive element at or near the focal point of the associated lens element so that, for each photosensitive element, the majority of the given surface area is shielded from any incident light by the opaque layer and the light transmissive region defines within the given surface area of the photosensitive element a surface portion for receiving light which is small in relation to the given surface area.

2. An image sensor according to claim 1, wherein each light transmissive region comprises an aperture within the opaque layer.

3. An image sensor according to claim 1, wherein the lens elements are carried by a further substrate mounted to the substrate carrying the photosensitive array.

4. An image sensor according to claim 1, wherein the opaque layer is common to all the photosensitive elements and is carried by the further substrate.

5. An image sensor according to claim 1, wherein the opaque layer is provided directly on the surface area of each photosensitive element.

6. An image sensor according to claim 5, wherein a separate opaque layer is provided on each photosensitive element.

7. An image sensor according to claim 6, wherein each opaque layer is electrically conductive and forms an electrode of the associated photosensitve element.

8. An image sensor according to claim 1, wherein the area of each light transmissive region is at most about five percent of the area of the associated photosensitive element.

9. An image sensor according to claim 8, wherein the ratio of the area of each light transmissive region to the surface area of each photosensitive element is in the region of from approximately 1:800 to approximately 1:8000.

10. An image sensor according to claim 1, wherein the lens elements are formed of reflowed photosensitive resist.

11. An image sensor according to claim 1, wherein the lens elements are formed by ion implanted regions of altered refractive index in a light transmissive substrate.

12. An image sensor according to claim 1, wherein the photosensitive array comprises a two-dimensional actively addressed array.

13. An image sensor according to claim 1, wherein the photosensitive elements comprise photosensitive diodes.

* * * * *